United States Patent
Fujii et al.

(10) Patent No.: US 7,868,496 B2
(45) Date of Patent: Jan. 11, 2011

(54) BRUSHLESS MOTOR STATOR

(75) Inventors: Hirokazu Fujii, Kusatsu (JP); Hiroki Fujita, Kusatsu (JP); Kouji Inoue, Kusatsu (JP); Mikio Itou, Kusatsu (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 12/443,541

(22) PCT Filed: Oct. 1, 2007

(86) PCT No.: PCT/JP2007/069193
§ 371 (c)(1),
(2), (4) Date: Mar. 30, 2009

(87) PCT Pub. No.: WO2008/041672
PCT Pub. Date: Apr. 10, 2008

(65) Prior Publication Data
US 2010/0033065 A1 Feb. 11, 2010

(30) Foreign Application Priority Data
Oct. 3, 2006 (JP) ............................. 2006-271837

(51) Int. Cl.
H02K 11/00 (2006.01)
(52) U.S. Cl. .................... 310/71; 310/43; 310/179
(58) Field of Classification Search ............... 310/43, 310/71, 194, 179
See application file for complete search history.

(56) References Cited

U.S. PATENT DOCUMENTS

| | | | |
|---|---|---|---|
| RE34,001 E * | 7/1992 | Wrobel ........................ 310/71 |
| 5,243,246 A * | 9/1993 | Sakamoto ................... 310/179 |
| 5,350,960 A * | 9/1994 | Kiri et al. ................... 310/194 |
| 5,532,533 A * | 7/1996 | Mizutani .................. 310/68 B |
| 5,635,781 A * | 6/1997 | Moritan ....................... 310/71 |
| 5,640,062 A * | 6/1997 | Yockey ..................... 310/68 D |
| 5,661,352 A * | 8/1997 | Oguchi et al. ................ 310/71 |
| 5,996,209 A * | 12/1999 | Molnar et al. ................ 29/596 |
| 6,531,796 B1 * | 3/2003 | Konno ...................... 310/67 R |
| 6,822,356 B2 * | 11/2004 | Suzuki et al. ................ 310/71 |
| 6,975,052 B2 * | 12/2005 | Uchida et al. ................ 310/71 |
| 2005/0046289 A1 * | 3/2005 | Uchida et al. ................ 310/71 |

FOREIGN PATENT DOCUMENTS

| | | |
|---|---|---|
| JP | 55-74109 A | 6/1980 |
| JP | 05-166159 A | 7/1993 |
| JP | 06-233505 A | 8/1994 |
| JP | 2002-112489 A | 4/2002 |
| JP | 2004-1091 A | 1/2004 |

* cited by examiner

Primary Examiner—Thanh Lam
(74) Attorney, Agent, or Firm—Global IP Counselors

(57) ABSTRACT

A plurality of winding parts are wound around teeth of an iron core with insulators disposed therebetween, and a printed wiring board is electrically connected to the winding part with a plurality of terminal pins. Each terminal pin is extends along an axial direction of the iron core and is attached to one of the insulators. An end portion of each winding part is wound around one of the terminal pins, and the terminal pin is soldered to the printed wiring board together with the end portion of the winding part. The terminal pins extend through hole portions of the printed wiring board.

4 Claims, 5 Drawing Sheets

BRUSHLESS MOTOR STATOR

CROSS-REFERENCE TO RELATED APPLICATIONS

This U.S. National stage application claims priority under 35 U.S.C. §119(a) to Japanese Patent Application No. 2006-271837, filed in Japan on Oct. 3, 2006, the entire contents of which are hereby incorporated herein by reference.

TECHNICAL FIELD

The present invention relates to a brushless motor stator to be used for, for example, air conditioners.

BACKGROUND ART

Conventionally, there has been a brushless motor stator having an iron core that has a plurality of teeth, winding parts wound via an insulator every teeth, and a printed wiring board that is placed on an axial end surface side of the iron core and electrically connected to the winding parts.

As shown in FIG. 5, in order to electrically connect the printed wiring board 101 with the winding part 102, an end portion 102a of the winding part 102 whose insulation coating had been peeled off has been wound around a lower side of a terminal pin 104 attached to the insulator 103 and soldered with preliminary solder 105. Then, the tip end of the terminal pin 104 has been put through a hole portion 101a of the printed wiring board 101, and the tip end of the terminal pin 104 has been soldered to the printed wiring board 101 with solder 106.

However, because of the provision of the preliminary solder 105, a space 107 for receiving the preliminary solder 105 is necessary between the printed wiring board 101 and the insulator 103, and this has led to a problem that the axial height dimension of the stator is increased.

When the brushless motor is employed in an air conditioner, the axial height dimension of the motor is restricted by the standard dimension of the air conditioner, and a reduction in the height dimension of the stator is demanded.

In order to solve the above problem, there is an example in which a terminal pin is formed in an L-like shape around which an end portion of a winding part is wound, and the L-shaped terminal pin is positioned outside the printed wiring board to restrict the axial height dimension of the stator (refer to JP 6-233505 A).

However, according to the above construction, the terminal pin has special specifications, and this leads to expensiveness in comparison with the standard terminal pin. Moreover, because of the structure in which the printed wiring board is positioned inside the terminal pin, there is a problem that it is difficult to mount the printed wiring board when the terminal pins are increased in number and the assembling workability deteriorates.

SUMMARY OF INVENTION

Technical Problem

An object of the present invention is to provide a brushless motor stator capable of improving the assembling workability while reducing the axial height dimension and suppressing the coat.

Solution to Problem

In order to solve the above problem, the brushless motor stator of the present invention comprises:

an iron core that has a plurality of teeth placed radially with respect to an axis;
a winding part wound via an insulator every teeth; and
a printed wiring board that is placed on an end surface side in an axial direction of the iron core and is electrically connected to the winding part, wherein
a terminal pin of a shape extended along the axial direction of the iron core is attached to an end surface in the axial direction of the iron core at the insulator,
one end of the terminal pin is attached to the end surface of the insulator,
an end portion of the winding part is wound around the other end of the terminal pin, and
the other end of the terminal pin and the end portion of the winding part are put through a hole portion of the printed wiring board and soldered to the printed wiring board.

With such a brushless motor stator in accordance with the present invention, the end portion of the winding part is wound around the other end of the terminal pin, and the other end of the terminal pin and the end portion of the winding part are put through the hole portion of the printed wiring board and soldered to the printed wiring board. Therefore, the terminal pin and the winding part are concurrently soldered to the printed wiring board, and this obviates the need for the (conventional) preliminary solder for soldering the winding part with the terminal pin. There is no need to provide a space for receiving the preliminary solder between the printed wiring board and the insulator, and the axial height dimension of the stator can be reduced.

Moreover, since the terminal pin has a shape extended along the axial direction of the iron core, the terminal pin is allowed to have a simple shape, and the cost can be suppressed. In addition, the printed wiring board can be mounted to the terminal pins along the axial direction of the iron core even if the terminal pins are increased in number, and the assembling workability becomes satisfactory.

Moreover, electrical connections by soldering the winding part, the terminal pin and the printed wiring board can be achieved at one time, and improvement of assembling workability and shortening of the time for the assembling work can be achieved. That is, even if the end portion of the winding part is wound around the terminal pin with the insulation coating unremoved, the winding part and the printed wiring board can be electrically connected together by melting the insulation coating by the heat of soldering.

In accordance with one aspect of the present invention, the winding part is wound around the terminal pin so as to become sparser on the inside of the hole portion of the printed wiring board than on the outside of at least one opening of the hole portion of the printed wiring board.

With such a brushless motor stator in accordance with this aspect of the present invention, the winding part is wound around the terminal pin so that the winding part becomes sparser on the inside of the hole portion of the printed wiring board than on the outside of at least one opening of the hole portion of the printed wiring board. Therefore, solder can easily enter the inside of the hole portion of the the printed wiring board and the winding part can reliably be electrically connected together.

In accordance with one aspect of the present invention, the winding part is wound around the terminal pin so as to become denser on the outside of both openings of the hole portion of the printed wiring board than on the inside of the hole portion of the printed wiring board.

With such a brushless motor stator in accordance with this aspect of the present invention, the winding part is wound around the terminal pin so as to become denser on the outside of both the openings of the hole portion of the printed wiring board than on the inside of the hole portion of the printed wiring board. Therefore, the winding part can be firmly fixed to the terminal pin.

In accordance with one aspect of the present invention, the terminal pin and the winding part are soldered to the printed wiring board with a lead-free solder.

With such a brushless motor stator in accordance with this aspect of the present invention, the terminal pin and the winding part are soldered to the printed wiring board with a lead-free solder. Therefore, the lead-free solder has a melting temperature higher than that of a solder that contains lead, and the insulation coating of the winding part can be melted more reliably by heat in the soldering process, allowing the winding part and the printed wiring board to be electrically connected together more reliably.

ADVANTAGEOUS EFFECTS OF INVENTION

According to the brushless motor stator of the invention, the end portion of the winding part is wound around the other end of the terminal pin, and the other end of the terminal pin and the end portion of the winding part are put through the hole portion of the printed wiring board and soldered to the printed wiring board. Therefore, the assembling workability can be improved while reducing the axial height dimension and suppressing the cost.

DESCRIPTION OF EMBODIMENTS

Figure 1:
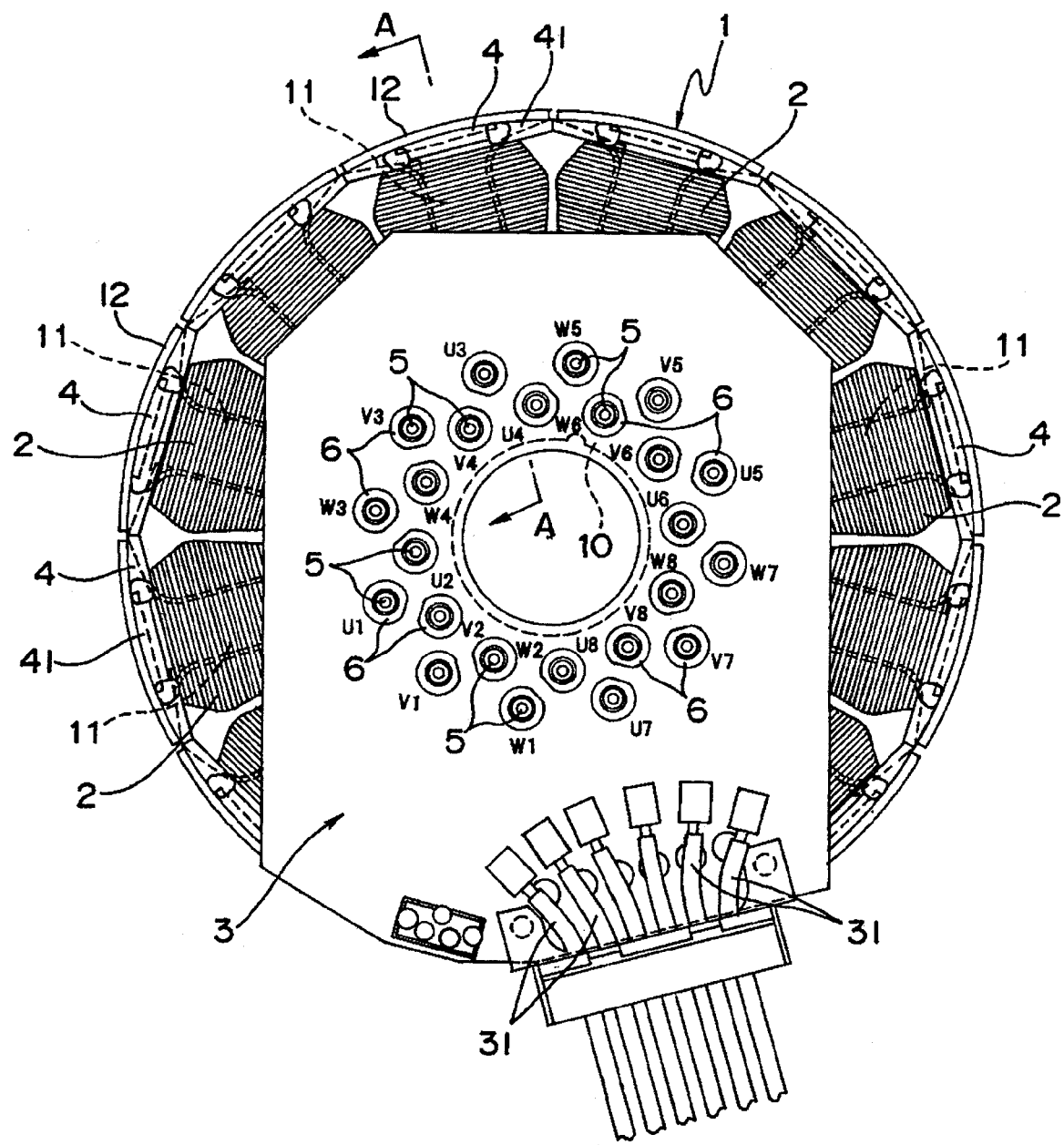
FIG. 1 is a plan view showing one embodiment of a brushless motor stator of the invention.

The present invention will be described in detail below by the embodiments shown in the drawings.

Figure 2:
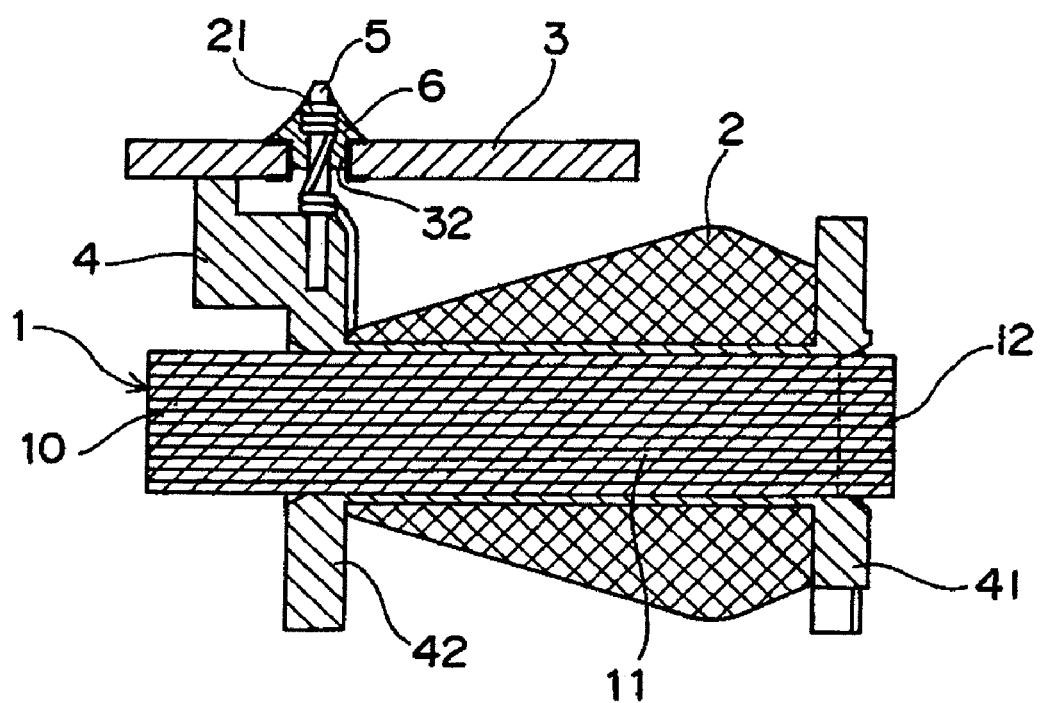
FIG. 2 is a sectional view taken along a line A-A of FIG. 1.

FIG. 1 shows a plan view of one embodiment of a brushless motor stator of the present invention, and FIG. 2 shows a sectional view taken along the line A-A of FIG. 1. The stator includes an iron core 1 that has a plurality of teeth 11 arranged radially with respect to an axis thereof, winding parts 2 wound via an insulator 4 every teeth 11, and a printed wiring board 3 that is placed on an end surface side in an axial direction of the iron core 1 and electrically connected to the winding parts 2.

The stator is the stator of a brushless motor for use in an air conditioner. The brushless motor is an outer rotor type motor, in which an annular rotor is placed outside the outer periphery of the stator.

The iron core 1 has an annular center core part 10 and the plurality of teeth 11 arranged radially outwardly on the outer peripheral surface of the core part 10. The plurality of teeth 11 are detachably attached radially outwardly to the core part 10.

The insulator 4 is made of, for example, resin and formed into a cylindrical shape having outer flanges 41, 42 at both ends. One outer flange 41 is formed with a width larger than that of the other outer flange 42.

The teeth 11 are constructed of, for example, a laminate steel plate and have a flange 12 at one end. The teeth 11 have the other end inserted in the insulator 4 from the outer flange 41 side at the one end and is mounted to the insulator 4.

The winding part 2 is mounted and wound between both the flanges 41, 42 of the insulator 4. The printed wiring board 3 has a plurality of wires 31 and externally supplies electricity to each of the winding parts 2 via the plurality of wires 31 to perform UVW three-phase control of the winding parts 2.

Figure 3:
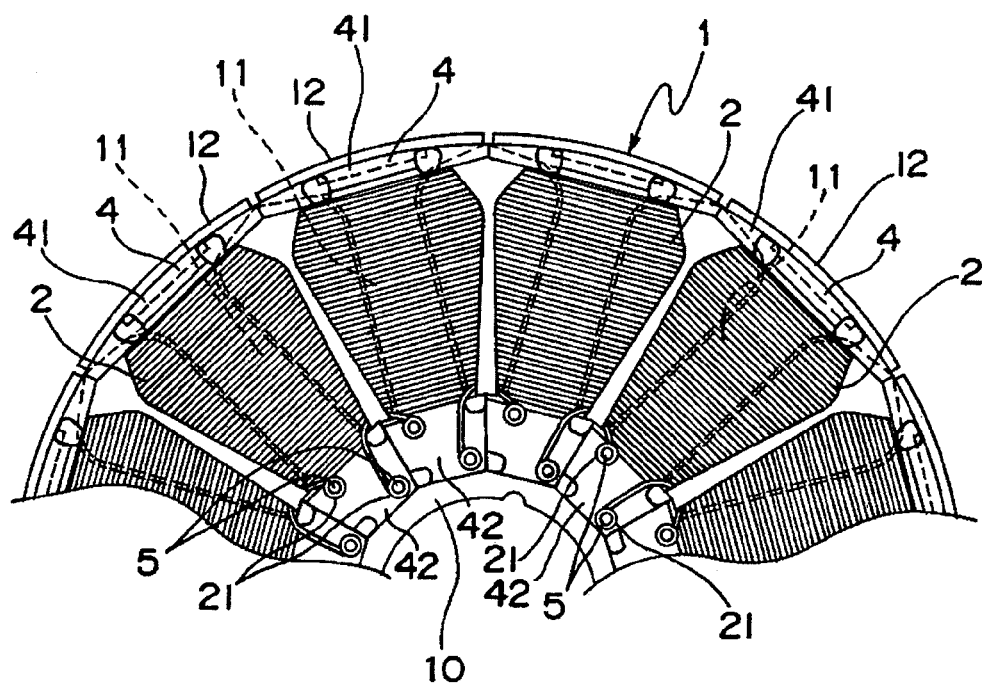
FIG. 3 is a plan view of a stator from which the printed wiring board is removed.

As shown in FIGS. 1 and 3, twelve insulators 4 are annularly arranged so that the insulators 4 each have the flange 41 located at one end positioned on the outer peripheral side and the flange 42 located at the other end positioned on the inner peripheral side. That is, the twelve teeth 11 are annularly arranged so that the flanges 12 of the teeth 11 face the outer peripheral side. FIG. 3 is a plan view of the stator from which the printed wiring board 3 is removed.

As shown in FIGS. 1, 2 and 3, terminal pins 5 of a shape extended along the axial direction of the iron core 1 is attached to the insulator 4 at an axial end surface side of the iron core 1. That is, two straight terminal pins 5 are implanted at the end surface of the outer flange 42 located at the other end of each insulator 4.

One end of the terminal pin 5 is attached to the end surface of the insulator 4, and an end portion 21 of the winding part 2 is wound around the other end of the terminal pin 5. The other end of the terminal pin 5 and the end portion 21 of the winding part 2 are put through a hole portion 32 of the printed wiring board 3 and soldered to the printed wiring board 3.

Figure 4:
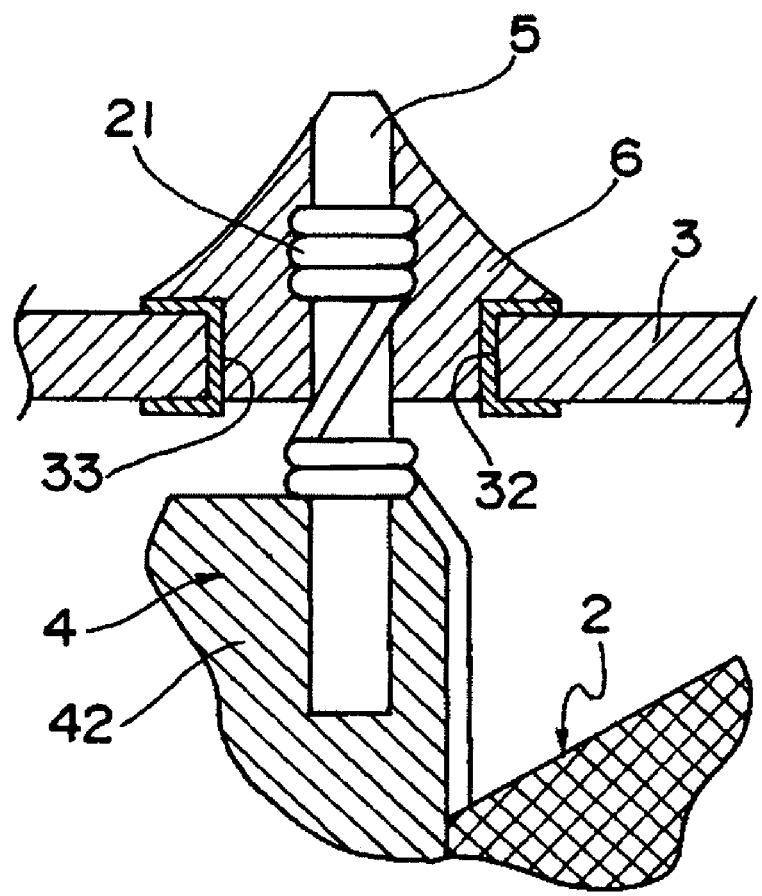
FIG. 4 is an enlarged view of an essential part of FIG. 2.
Figure 5:
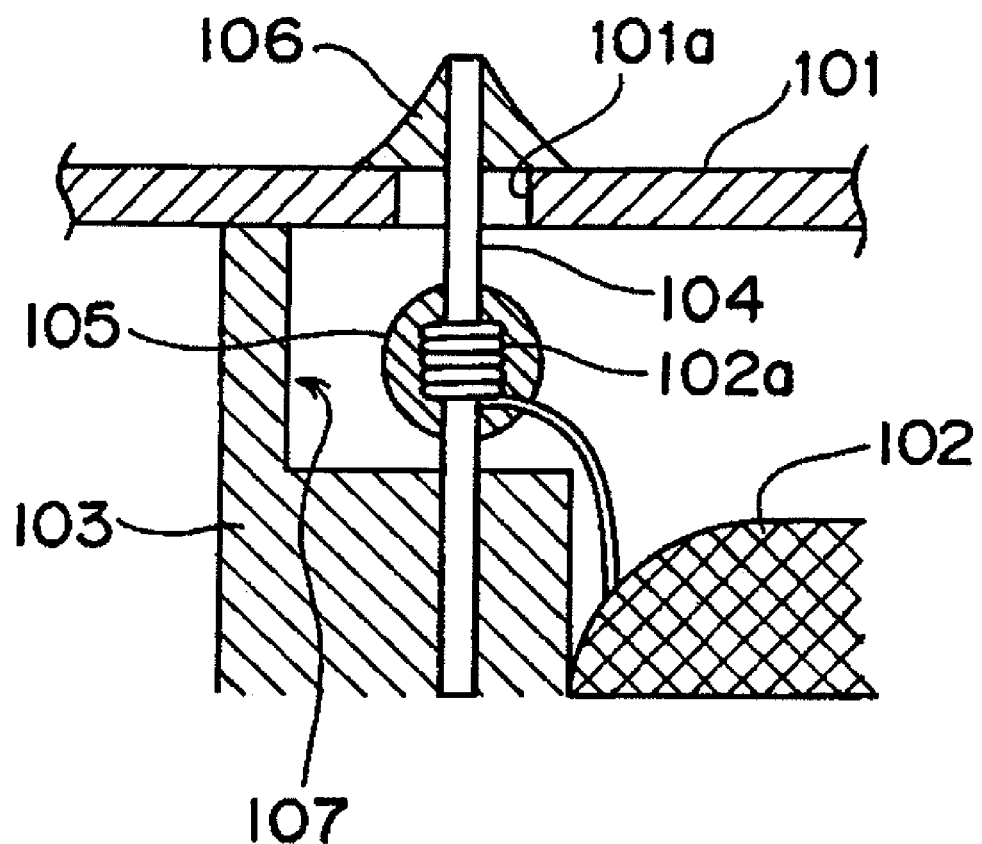
FIG. 5 is a sectional view showing a stator of a conventional brushless motor.

As shown in the enlarged view of FIG. 4, an electrode 33 constructed of a copper foil is provided on the inner surface of the hole portion 32 of the printed wiring board 3. The winding part 2 is wound around the terminal pin 5 so as to become sparser on the inside of the hole portion 32 of the printed wiring board 3 than on the outside of at least one opening of the hole portion 32. In other words, the winding part 2 wound around the terminal pin 5 on the inside of the hole portion 32 is sparser than the winding part 2 wound around the terminal pin 5 on the outside of the hole portion 32.

Moreover, the winding part 2 is wound around the terminal pin 5 so as to become denser on the outside of both the openings of the hole portion 32 than on the inside of the hole portion 32. In other words, the winding part 2 wound around the terminal pin 5 on the outside of the hole portion 32 is denser than the winding part 2 wound around the terminal pin 5 on the inside of the hole portion 32.

The solder 6 covers part of the winding part 2 located on the outside of the hole portion 32 opposite from the insulator 4 and fills up the hole portion 32. That is, the solder 6 electrically connects the end portion 21 of the winding part 2 with the electrode 33 of the printed wiring board 3 at the hole portion 32. The solder 6 is a lead-free solder and has a melting temperature about 20° C. to 50° C. higher than that of the solder that contains lead.

In concrete, for example, an Sn—Ag—Cu type that has a melting temperature of 217 degrees or an Sn—Cu—Ni+Ge type that has a melting temperature of 227 degrees is used as the lead-free solder. It is noted that the melting temperature of the eutectic solder is 183 degrees.

Next, explaining the assembling of the stator with reference to FIGS. 1 and 4, the end portion 21 of the winding part 2 is wound around and fixed to the terminal pin 5 of the insulator 4. At this time, the insulation coating of the winding part 2 is not peeled off.

Then, the printed wiring board 3 is moved along the axial direction of the iron core 1, and the printed wiring board 3 is placed on the insulator 4 while inserting the terminal pin 5, around which the end portion 21 of the winding part 2 is wound, into the hole portion 32.

Subsequently, the solder 6 is poured to the terminal pins 5 from the side opposite from the insulator 4 with respect to the printed wiring board 3, performing soldering of the terminal pin 5 with the printed wiring board 3.

At this time, the end portion 21 of the winding part 2 is wound around the terminal pin 5 with the insulation coating unremoved. However, the winding part 2 and the printed wiring board 3 can be electrically connected together by melting the insulation coating by the heat of soldering. The solder 6, which is the lead-free solder, has a high melting temperature and is able to reliably melt the insulation coating of the winding part 2 by heat.

Moreover, the winding part 2 is wound around the terminal pin 5 so as to become sparser on the inside of the hole portion 32 of the printed wiring board 3 than on the outside of the hole portion 32 of the printed wiring board 3. Therefore, the solder 6 can easily enter the inside of the hole portion 32 of the printed wiring board 3, and the electrode 33 provided on the inner surface of the hole portion 32 of the printed wiring board 3 and the winding part 2 can reliably be electrically connected together.

Moreover, the winding part 2 is wound around the terminal pin 5 so as to become denser on the outside of both the openings of the hole portion 32 of the printed wiring board 3 than on the inside of the hole portion 32 of the printed wiring board 3. Therefore, the winding part 2 can be firmly fixed to the terminal pin 5.

According to the brushless motor stator of the above construction, the end portion 21 of the winding part 2 is wound around the other end of the terminal pin 5, and the other end of the terminal pin 5 and the end portion 21 of the winding part 2 are put through the hole portion 32 of the printed wiring board 3 and soldered to the printed wiring board 3. Therefore, the terminal pin 5 and the winding part 2 are concurrently soldered to the printed wiring board 3, and this obviates the need for the (conventional) preliminary solder for soldering the winding part 2 with the terminal pin 5. There is no need to provide a space for receiving the preliminary solder between the printed wiring board 3 and the insulator 4, and the axial height dimension of the stator can be reduced.

Moreover, since the terminal pin 5 has a shape extended along the axial direction of the iron core 1, the terminal pin 5 is allowed to have a simple shape, and the cost can be suppressed. In addition, the printed wiring board 3 can be mounted to the terminal pin 5 along the axial direction of the iron core 1 even if the terminal pins 5 are increased in number, and the assembling workability becomes satisfactory.

Moreover, electrical connections by soldering the winding part 2, the terminal pin 5 and the printed wiring board 3 can be achieved at one time, and improvement of assembling workability and shortening of the time for the assembling work can be achieved. That is, even if the end portion 21 of the winding part 2 is wound around the terminal pin 5 with the insulation coating unremoved, the winding part 2 and the printed wiring board 3 can be electrically connected together by melting the insulation coating by the heat of soldering.

It is noted that the invention is not limited to the above embodiment. For example, it is acceptable to apply the stator of the invention to an inner rotor type motor in which the stator is placed on the outer peripheral side and the rotor is placed on the inner peripheral side. Moreover, the teeth 11, the insulators 4 and the terminal pins 5 may be freely increased or decreased in the number.

What is claimed is:

1. A brushless motor stator comprising:
    an iron core having a plurality of teeth extending radially with respect to an axis;
    a plurality of winding parts, each winding part being wound on a respective one of the teeth with an insulator disposed between the winding part and the respective one of the teeth; and
    a printed wiring board disposed on an end surface side of the iron core relative to an axial direction of the iron core, with the printed wiring board being electrically connected to the winding parts with a plurality of terminal pins,
    at least one of the terminal pins being attached to an end surface of a respective one of the insulators that faces in the axial direction of the iron core and extending along the axial direction,
    a first end of the at least one of the terminal pins being attached to the end surface of the respective one of the insulators,
    an end portion of a respective one of the winding parts being wound around a second end of the at least one of the terminal pins,
    the second end of the at least one of the terminal pins having the end portion of the respective one of the winding parts wound therearound extending through a respective one of a plurality of hole portions of the printed wiring board and being soldered to the printed wiring board,
    the end portion of the respective one of the winding parts being wound around the at least one of the terminal pins so as to be denser outside of the respective one of the hole portions of the printed wiring board than inside of the respective one of the hole portions of the printed wiring board, and
    the respective one of the hole portions includes an inside opening and an outside opening with the outside of the respective one of the hole portions being outside of both the inside and outside openings.

2. The brushless motor stator as claimed in claim 1, wherein
    the at least one of the terminal pins and the end portion of the respective one of the winding parts are soldered to the printed wiring board with a lead-free solder.

3. The brushless motor stator as claimed in claim 1, wherein
    an insulation coating of the end portion of the respective one of the winding parts is not peeled off when soldering the end portion of the respective one of the winding parts to the printed wiring board.

4. The brushless motor stator as claimed in claim 2, wherein
    an insulation coating of the end portion of the respective one of the winding parts is not peeled off when soldering the end portion of the respective one of the winding parts to the printed wiring board.

* * * * *